United States Patent [19]

Taylor et al.

[11] Patent Number: 5,329,137
[45] Date of Patent: Jul. 12, 1994

[54] INTEGRATED TOTAL INTERNAL REFLECTION OPTICAL SWITCH UTILIZING CHARGE STORAGE IN A QUANTUM WELL

[75] Inventors: Geoffrey W. Taylor, Holmdel; Tim Vang, Belmar, both of N.J.

[73] Assignee: The United States of America as represented by the Secretary of the Air Force, Washington, D.C.

[21] Appl. No.: 66,322

[22] Filed: May 21, 1993

Related U.S. Application Data

[63] Continuation-in-part of Ser. No. 731,591, Jul. 17, 1991, abandoned.

[51] Int. Cl.5 .................... H01L 27/14; H01L 31/00
[52] U.S. Cl. ........................ 257/21; 257/20; 257/184; 257/187
[58] Field of Search .................. 257/21, 15, 27, 20, 257/184, 187

[56] References Cited

U.S. PATENT DOCUMENTS

| | | | |
|---|---|---|---|
| 4,689,115 | 8/1987 | Ibbotson et al. | 156/646 |
| 4,751,194 | 6/1988 | Cibert et al. | 437/24 |
| 4,761,620 | 8/1988 | Bar-Joseph et al. | 332/7.51 |
| 4,806,997 | 2/1989 | Simmons et al. | 357/17 |
| 4,872,744 | 10/1989 | Abeles et al. | 357/16 |
| 4,877,299 | 10/1989 | Lorenzo et al. | 357/17 |
| 4,899,201 | 2/1990 | Xu et al. | 357/22 |
| 5,010,374 | 4/1991 | Cooke et al. | 357/61 |
| 5,111,255 | 5/1992 | Kiely et al. | 357/17 |

OTHER PUBLICATIONS

Fowles, G. R., *Introduction to Modern Optics*, 1975, 45–46.

*Primary Examiner*—Sara W. Crane
*Attorney, Agent, or Firm*—Donald J. Singer; Irwin P. Garfinkle

[57] ABSTRACT

An optical switch comprises a heterojunction transistor having a source electrode, a gate, a mesa, and three self-aligned waveguides, the mesa being ion implanted and having a single quantum well under the gate electrode, the single quantum well being comprises of undoped, narrow bandgap material bound on both sides by regions p-doped, wide bandgap material, both of said p-doped regions have symmetrically graded bandgaps, being most narrow next to the quantum well and increasing out to a wide and constant value away from the quantum well. A highly n-doped and totally depleted charge sheet is placed in a wide bandgap material, very near the gate side of the quantum well heterojunction. The charge sheet serves to induce a voltage controllable inversion channel within the quantum well. A source of optical energy is applied to one of said waveguides, and a total internal reflection is created in the switch by inducing a change in refractive index under the gate by means of a charge applied from the source electrode.

3 Claims, 2 Drawing Sheets

INTEGRATED TOTAL INTERNAL REFLECTION OPTICAL SWITCH UTILIZING CHARGE STORAGE IN A QUANTUM WELL

STATEMENT OF GOVERNMENT INTEREST

The invention described herein may be manufactured and used by or for the Government for governmental purposes without the payment of any royalty thereon.

This application is a continuation-in-part, of application Ser. No. 07/731,591, filed 17 Jul. 1991, now abandoned.

BACKGROUND OF THE INVENTION

Development of an integrated Total Internal Reflection (TIR) optical switch necessitates the creation of a region of light propagation with controllable change in refractive index. This region with refractive index change has an effective change in reflectivity to the incident light via the Fresnel relations.

The Fresnel relations describe the reflection and transmission of light as it is incident on an interface between two regions at some angle of incidence. The amount of light transmitted and reflected depends on both the angle of indigence and the difference in the refractive indices of the two regions. For a fixed difference in refractive index between the two layers there is some angle for which all of the incident light is reflected. This is called total internal reflection, and the incident angle producing it is called the critical angle. Similarly, for a fixed angle of incidence there is some refractive index difference that also creates total internal reflection. Also, if the is no difference in refractive index between the two regions, then the reflection is zero for all angles. By increasing the difference in the refractive indices between the two regions, the critical angle becomes closer to the normal to the interface. By making the critical angle closer to the normal to the interface, the physical area used by the switch and the associated waveguide ports is reduced. This means that the maximum controllable change in index of refraction is desirable to create the smallest integral TIR optical switch. The TIR optical switch uses a fixed angle of incidence between the input waveguide and the controlling electrode of the TIR optical switch, and then uses control of the refractive index difference between the waveguide region and the controlling electrode region to operate the device. Knowledge of the refractive index difference obtainable with the TIR optical switch allows the fixed incident angle to be chosen so that the total internal reflection of the incident light is obtained when the device is on.

Control of this change allows selection of the incident light to be transmitted (TIR off) to output port 1, or reflected (TIR on) to output port 2. Current investigation into creating this controllable change in refractive index for use in a TIR optical switch is centered in two major areas. One uses a forward biased p-n junction in which the light is incident laterally on the junction (see K. Ishida et al, InGaAsp/InP Optical Switches Using Carrier Induced Refractive Index Change, Applied Physics Letters, Volume 50(3), pp 141-142, 19 Jan. 1987). The other uses an electric field applied perpendicularly to a multiple quantum well region where the incident light is perpendicular to the applied field (see H. Yamamoto et al, Intersectional Waveguide Type Optical Switch With Quantum Well Structure, Transaction of the IECE of Japan, Volume E68, pp 737-739, 1985).

The forward biased p-n junction TIR switch is based on the change in refractive index due to the introduction of free carriers in the junction. The magnitude of change is limited only by the maximum forward bias current of the junction, i.e., the amount of charge in the junction. However, the forward biased p-n junction TIR switch is limited in speed by the recombination lifetimes of the electron-hole pairs, which is on the order of a few nanoseconds.

The electric field controlled TIR switch uses the refractive index change attributable to the Quantum Confined Stark Effet (QCSE) found at room temperature in quantum wells. (For example, see Weiner et al, Quadratic Electro-Optic Effect Due To The Quantum-Confined Stark Effect in Quantum Wells, Applied Physics Letters, Volume 50(13), pp 842-844, 30 Mar. 1987). The QCSE optical switch is based on the change in excitonic absorption within a quantum well due to an applied electric field. This change in absorption is coupled to a change in refractive index via the Kramers-Kronig relations. Typical device geometries use a reverse biased p-i-n structure, where the multiple quantum wells compose the intrinsic region. The switching capability of these devices is limited by the breakdown field of the material (approximately $10^{+5}$ V/cm). It is noted that the apparent breakdown field (i.e., when the destructive breakdown of the device occurs) is lowest in a p-i-n junction because the field creates a large depletion region in which many impact ionization collisions may occur. If the high field region were to be limited to a small volume, say a single quantum well, such that sufficient energy for ionization cannot be obtained, then a field much higher than the p-i-n junction breakdown may be applied without device breakdown.

SUMMARY OF THE INVENTION

The optical switch disclosed in accordance with the invention creates a total internal reflection by inducing a change in refractive index under the gate of a heterojunction transistor (HFET), see Taylor and Simmon, Heterojunction Field Effect Transistor, Electronics Letters, Volume 22(15), pp 784-786, 17 Jul. 1986. It is structurally identical to the HFET, which is characterized by a single quantum well of undoped, narrow bandgap material, which is bound on both sides by p-doped, wide bandgap material. Both p-doped regions have symmetrically graded bandgaps, being most narrow next to the quantum well an increasing out to a wide and constant value away from the quantum well. A highly n-doped and totally depleted charge sheet is placed in the wide bandgap material, very near the gate side of the quantum well heterojunction. This charge sheet induces a voltage controllable inversion channel within the quantum well. Self aligned junction contact to the charge sheet form sources to the inversion channel. In the operation of the present optical switch a positive gate to source voltage allows carrier densities in a heavily inverted channel to exceed $10^{19}/cm^3$, which is much greater than the carrier densities found in a forward biased p-n junction. Note that this is a majority carrier action as holes are not present. Thus, there is not direct current flow, and no recombination associated with the injection or removal of electrons. For short gate lengths, the electron conduction both into and out of the inversion channel is by velocity saturation as in the HFET. The large increase in electron concentration within the quantum well between the off and on states will cause band filling of the two dimensional conduction band states which causes a blue-shift of the fundamental absorption edge, similar to the Moss-Burstein effect in bulk semiconductor materials. (For example, see Pankove, Optical Processes In Semiconductors, Dover Publications (1971) p. 39). Introduction of high electron density in the channel also induces very high electric fields (approximately $6 \times 10^5$ V/cm) at the heterojunction surface, and thus effectively within the quantum well. These high fields will red shift and broaden the excitonic absorption peaks in the quantum well via the QCSE. The importance of these effects for the present invention is found in the Kramers-Kronig relations, which describe the relationship between the real and imaginary parts of a complex quantity. In this case the total index of refraction being the complex quantity, with the usual index of refraction being the real part and the absorption being proportional to the imaginary part. Simply put, a change in the optical absorption induces a change in the refractive index. Hence in the HFET both band filling and the QCSE are used to maximize the change in the absorption which maximizes the change in the index of refraction, whereas in all other structures, it is not possible to combine the two effects. This invention produces large band filling, without direct current flow, and in addition, induces high electric fields in the quantum well producing the Quantum Confined Stark Effect (QCSE), which in total will allow a greater change in the index of refraction than presently found, an thus greater control of the reflection and transmission of the incident optical wave. Furthermore, the speed of the switch is that of a field effect transistor, which can easily extend into the multi-gigahertz range.

OTHER PRIOR ART

A search revealed the following prior art United States patents:

Ibbotson, U.S. Pat. No. 4,689,115 which teaches a process for preparing Group III-IV compound semiconductor devices employing a gaseous etching process.

The patent to Cibert, U.S. Pat. No. 4,751,194 teaches a method of fabricating semiconductor structures having quantum wells for carrier confinement.

Bar-Joseph, U.S. Pat. No. 4,761,201 teaches an optical method of reading a semiconductor quantum well device.

The patent to Xu, U.S. Pat. No. 4,899,201 teaches semiconductor two-dimensional p-type quantum well.

None of the prior art discloses the optical switch disclosed herein.

DESCRIPTION OF THE DRAWINGS

For a clearer understanding of the nature of this invention reference should now be made to the accompanying drawings in which.

DESCRIPTION OF THE PREFERRED EMBODIMENT

Figure 1:
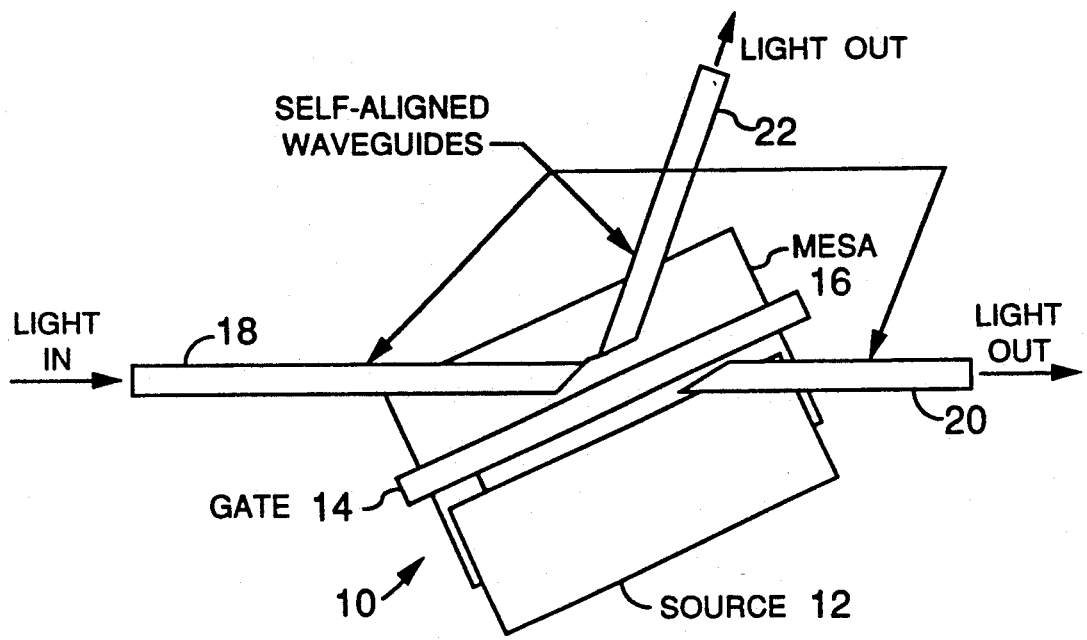
FIG. 1 is a diagrammatic representation of a plan view of the device in accordance with this invention.
Figure 2:
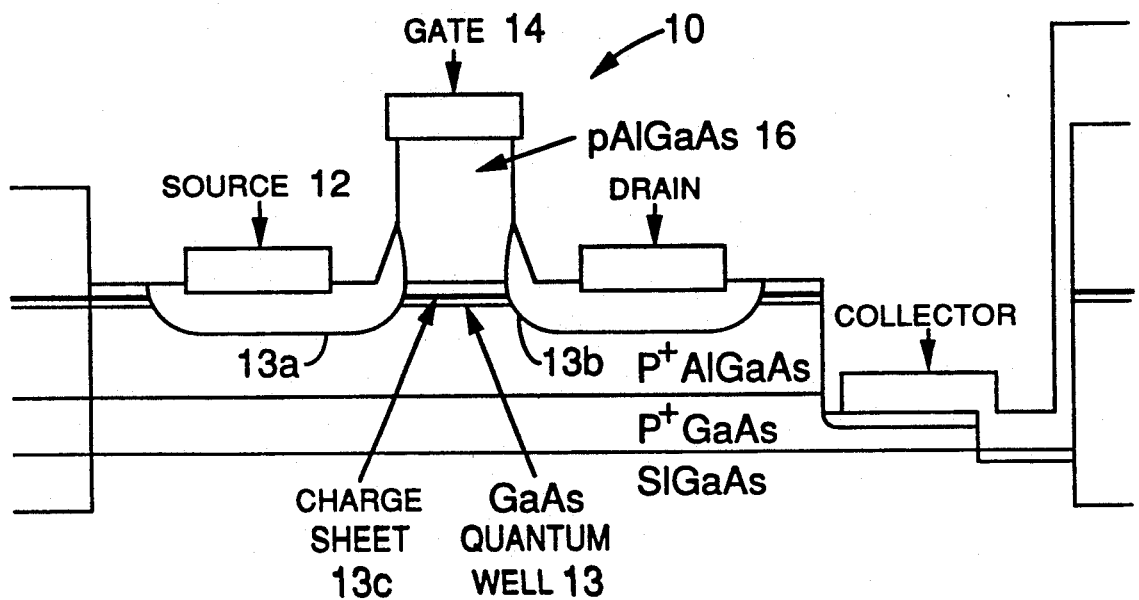
FIG. 2 is a sectional view of FIG. 1.
Figure 3:
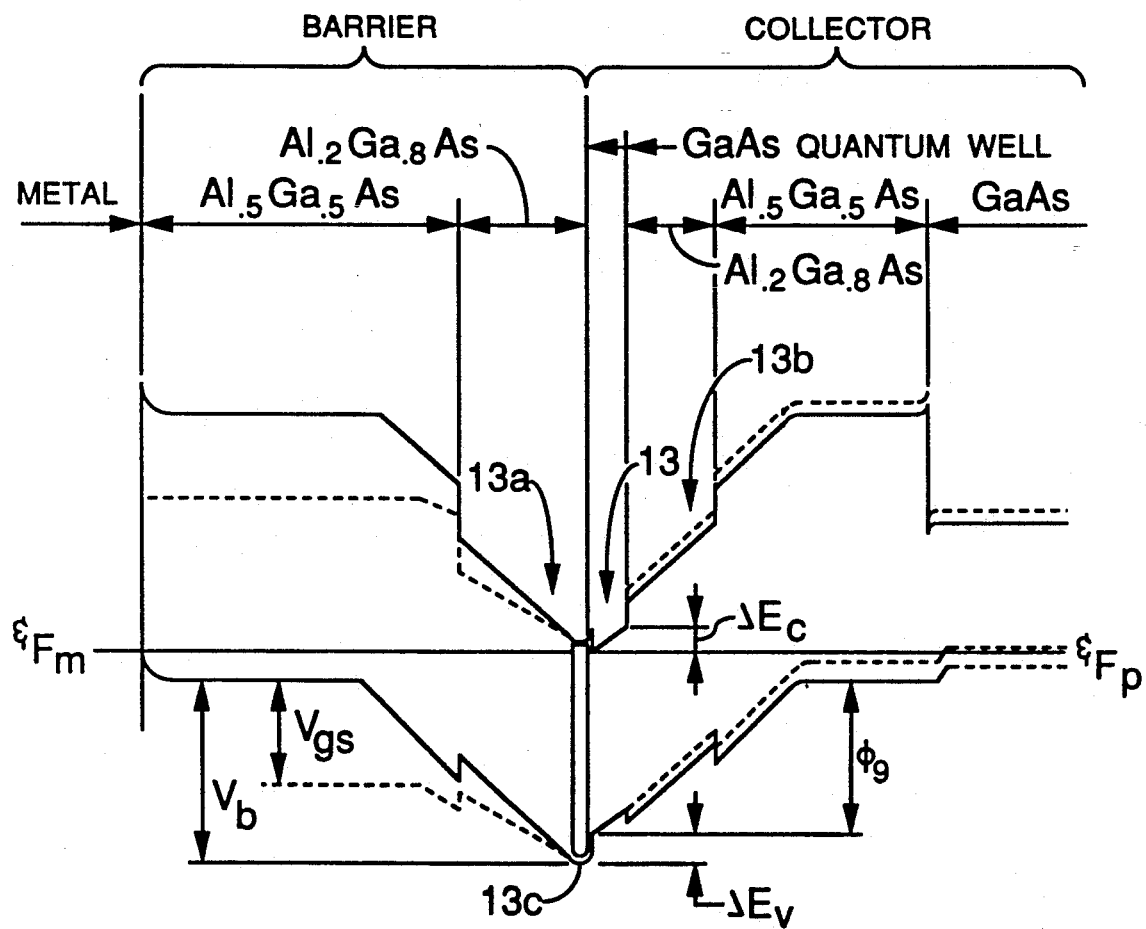
FIG. 3 is an energy band diagram of the illustrated device.

As seen in the drawings, the optical switch 10 disclosed in accordance with the invention comprises a heterojunction transistor of the type disclosed in a paper by Taylor and Simmons, entitled Heterojunction Field Effect Transistor, and published in Electronic Letters, Volume 22(15), pp 784-786, 17 Jul. 1986, which publication is incorporated herein by reference. As shown herein, the switch 10 includes a source electrode 12, a gate 14, a mesa 16, and three self-aligned waveguides 18, 20 an 22.

The self-alignment of the waveguides 18,20 and 22 refers to their definition by the same photolithographic mask used to define the gate electrode. Since the angles of incidence of input waveguide 18, transmission waveguide 20 and reflection waveguide 22 that are made with the gate electrode 14 are defined by the same photolithographic mask that makes the gate electrode. This insures absolute control of these angles as well as the small spacing required between the waveguides and the gate electrode to electrically isolate the TIR optical switch.

The definition of the waveguides along with the gate electrode means that the waveguides will have a refractory metal layer on top of the highly p-doped semiconductor found at the surface, as it is this metal (typically sputtered tungsten) that is used to make the ohmic gate contact. The metal used to define the gate electrode along with the three waveguides is then used as a mask for the etching away of the semiconductor material outside of the regions protected by the metal. The depth of the etch is typically about 1 μm, and is such that approximately 1500 Å of semiconductor (in region 13b) is left covering the quantum well (region 13) outside of the metal covered regions. This etching is performed in a Reactive Ion Etching (RIE) chamber using the gas $SF_6$ which is a non-isotropic etch and is used to etch approximately 3500 Å from the quantum well. The final 2000 Å of semiconductor is etched with an isotropic wet chemical etch consisting of $H_3PO_4$, $H_2O_2$ and $H_2O$, in a 1:8:120 ratio. The etching not only defines the gate contact, but also creates rib waveguides that confine the light in the lateral direction. The mesa 16 is then ion implanted having a single quantum well 13 under the gate electrode 14. The ion implantation is self-aligned to the gate electrode 14 and extends to the outside of the mesa 16 on the source side 12 of the mesa 16 only. This implantation is typically $Si^+$ ions with a dose of approximately $2 \times 10^{14} cm^{-2}$ and a depth of approximately 1500 Å. The device is then given a Rapid Thermal Anneal (RTA) of 950 degrees C. for ten seconds that activates the $Si^+$ ions, and a gold electrode is formed by a standard lift-off procedure to make an ohmic contact to the source 12 region. The self-aligned implant, RTA, and gold contact is used to make the n type source contact to the inversion channel. The device enables total internal reflection by inducing a change in refractive index under the gate 14, by a voltage applied between the gate electrode 14 and source electrode 12. The single quantum well 13 is comprised of undoped, narrow bandgap material, which is bound on both sides 13a and 13b by p-doped, wide bandgap material. Both p-doped regions have symmetrically graded bandgaps, being most narrow next to the quantum well 13 and increasing out to a wide and constant value away from the quantum well. A highly n-doped and totally depleted charge sheet 13c is placed in the wide bandgap material, very near the gate side of the quantum well heterojunction. This charge sheet induces a voltage controllable inversion channel within the quantum well. Self aligned junction contact to the charge sheet form sources to the inversion channel.

Introduction 12 of a high electron density in the channel due to a gate 14 to source bias also induces very high electric fields (approximately $6 \times 10^{+5}$ V/cm) at the heterojunction interface 15, and thus effectively within the quantum well 13. These high fields will red shift and broaden the excitonic absorption peaks via the QCSE. The importance of these effects for the present invention is found in the Kramers-Kronig relations, which describe the relationship between the real and imaginary parts of a complex quantity. In this case the total index of refraction being the complex quantity, with the usual index of refraction being the real part and the absorption being proportional to the imaginary part. Simply put, a change in the optical absorption induces a change in the refractive index. Hence in the device, both band filling and the QCSE can be used to maximize change in the index of refraction, whereas in all other structures, it is not possible to combine the two effects.

This invention produces large band filling, without direct current flow, and in addition, induces high electric fields in the quantum well 13 producing the QCSE, which in total will allow a greater change in the index of refraction than presently found, and thus greater control of the reflection and transmission of the incident optical wave. Furthermore, the speed of the switch is that of a field effect transistor, which can easily extend into the multi-gigahertz range. Thus by changing the charge in the quantum well 13, a source of light applied to the waveguide 18, can be switched from the direct path through the waveguide 20, to the reflected path through the waveguide 22.

In the operation of the optical switch, a positive gate to source voltage allows carrier densities in a heavily inverted channel to exceed $10^{19}/cm^3$, which is much greater than the carrier densities found in a forward biased p-n junction. Note that this is a majority carrier action as holes are not present, thus, there is no direct current flow, and no recombination associated with the injection or removal of electrons. For short gate lengths, the electron conduction both into and out of the inversion channel is by velocity saturation. The large increase in carrier concentration with the quantum well between the OFF and ON states will effectively cause band filling of the conduction band in the quantum well which leads to a blue shift of the fundamental absorption edge, known as the Moss-Burstein shift in bulk semiconductors.

It will be apparent to persons skilled in the art that this invention is subject to various modifications and adaptations. It is intended therefore, that the scope of the invention be limited only by the following claims as interpreted in the light of the prior art.

What is claimed is:

1. A total internal reflection optical switch comprising a heterojunction transistor having a self-aligned ion implanted source, an ohmic gate, a mesa, and three self-aligned waveguides, said waveguides being defined with the same photolithographic mask as the ohmic gate to insure precise alignment, a single quantum well under the ohmic gate, the single quantum well being comprised of undoped, narrow bandgap material bound on both sides by two regions of p-doped, wide bandgap material, both of said p-doped regions have symmetrically graded bandgaps, being most narrow next to the quantum well and increasing out to a wide and constant value away from the quantum well, a highly n-doped and totally depleted charge sheet in the wide bandgap material, very near the gate side of the quantum well heterojunction, said charge sheet inducing a voltage controllable inversion channel within the quantum well, said three waveguides comprising a single input port and two output ports, said two output ports comprising a straight through optical path and a reflection optical path, a source of optical energy applied to said single input port, the energy from said source of optical energy being directed into and out of the region under the ohmic gate by said waveguides, a total internal reflection being created in said switch which routes the optical energy to said reflection optical path by inducing a change in refractive index under the ohmic gate by means of a voltage applied between the ohmic gate and the source electrode.

2. A total internal reflection optical switch between an input waveguide a straight through output waveguide and a reflection output waveguide, said switch in a first mode functioning to transmit optical energy from said input waveguide through said straight through output waveguide, and in a second mode to said reflection output waveguide, said switch comprising:
    a self aligned ion implanted source electrode;
    an ion implanted mesa;
    an ohmic gate electrode;
    a mesa between said gate electrode and said source electrode
    an ion implanted quantum well located in said mesa under said gate, said quantum well being comprised of undoped, narrow bandgap material bound on both sides by regions of p-doped, wideband material, both of said p-doped regions having symmetrically graded bandgaps, being most narrow next to the quantum well and increasing out to a wide and constant value away from the quantum well;
    and a highly n-doped and totally depleted charge sheet in the wide bandgap material, very near the gate side of the quantum well heterojunction, said charge sheet inducing a voltage controllable inversion channel within the quantum well;
    said input waveguide being coupled to said first and second output waveguide through said mesa, the index of refraction of said mesa being changeable by altering the charge between said gate and source electrodes, such change resulting in a total internal reflection.

3. The switch as defined in claim 2 wherein said waveguides are defined with the same photolithographic mask as the ohmic gate to insure precise alignment.

* * * * *